US009087713B2

(12) United States Patent
Banerjee

(10) Patent No.: US 9,087,713 B2
(45) Date of Patent: Jul. 21, 2015

(54) SEMICONDUCTOR DEVICE WITH SHARED REGION

(71) Applicant: Power Integrations, Inc., San Jose, CA (US)

(72) Inventor: Sujit Banerjee, San Jose, CA (US)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 13/650,484

(22) Filed: Oct. 12, 2012

(65) Prior Publication Data

US 2014/0104888 A1 Apr. 17, 2014

(51) Int. Cl.
*H01L 29/808* (2006.01)
*H01L 27/07* (2006.01)
*H01L 29/861* (2006.01)
*H01L 29/06* (2006.01)
*H02M 1/32* (2007.01)
*H02M 1/36* (2007.01)
*H02M 1/00* (2007.01)

(52) U.S. Cl.
CPC .......... *H01L 27/0727* (2013.01); *H01L 29/808* (2013.01); *H01L 29/861* (2013.01); *H01L 29/8611* (2013.01); *H01L 29/0623* (2013.01); *H01L 29/0696* (2013.01); *H02M 1/32* (2013.01); *H02M 1/36* (2013.01); *H02M 2001/0006* (2013.01)

(58) Field of Classification Search
CPC ......... H01L 29/76; H01L 29/78; H01L 29/72; H01L 27/0727; H01L 29/808; H01L 29/861; H01L 29/8611; H01L 29/0696; H01L 29/0623; H02M 2001/0006; H02M 1/32; H02M 1/36

USPC .................. 257/256–287, 104–107, E21.403, 257/E21.421, 272, E26.016; 363/12, 20, 363/21, 49, 50, 17, 16
See application file for complete search history.

(56) References Cited

U.S. PATENT DOCUMENTS

| 4,292,642 A * | 9/1981 | Appels et al. ................. 257/169 |
| 4,422,089 A * | 12/1983 | Vaes et al. ..................... 257/492 |
| 5,162,970 A | 11/1992 | Davis, Jr. et al. |
| 5,650,357 A | 7/1997 | Dobkin et al. |
| 6,384,478 B1 | 5/2002 | Pour |
| 6,865,093 B2 | 3/2005 | Disney |
| 6,998,952 B2 | 2/2006 | Zhou et al. |
| 7,405,913 B2 * | 7/2008 | Tobisaka et al. ................ 361/56 |

(Continued)

FOREIGN PATENT DOCUMENTS

JP H09260569 A 10/1997

*Primary Examiner* — David Vu
*Assistant Examiner* — Mouloucoulaye Inoussa
(74) *Attorney, Agent, or Firm* — Blakely Sokoloff Taylor & Zafman LLP

(57) ABSTRACT

A semiconductor device having a JFET and diode, includes a substrate, a second well region, and a second doped region that are of a first conductivity type. The JFET also includes a first well region, a first doped region, and a shared region that are of the second conductivity type. The second well region is disposed in the substrate adjacent to the first well region. A source of the JFET includes the first doped region disposed in the first well region. An anode of the diode includes the second doped region disposed in the second well region. Both a drain of the JFET and a cathode of the diode include the shared region disposed in the first well region. A diode current flows along a first lateral axis of the device while a JFET current flows along a second lateral axis of the device.

21 Claims, 8 Drawing Sheets

(56) References Cited

U.S. PATENT DOCUMENTS

| | | |
|---|---|---|
| 7,468,547 B2 | 12/2008 | Harvey |
| 7,524,731 B2 | 4/2009 | Wang |
| 7,619,297 B2 | 11/2009 | Wang |
| 7,868,431 B2 | 1/2011 | Feng et al. |
| 7,884,696 B2 | 2/2011 | Hébert et al. |
| 8,093,983 B2 | 1/2012 | Fouquet et al. |
| 8,120,097 B2 | 2/2012 | Disney |
| 8,164,125 B2 | 4/2012 | Banerjee et al. |
| 8,772,909 B1 | 7/2014 | Vinciarelli |
| 2004/0214376 A1 | 10/2004 | Gibson et al. |
| 2005/0271148 A1 | 12/2005 | Dupuis |
| 2007/0058398 A1* | 3/2007 | Yang et al. .............. 363/16 |

* cited by examiner

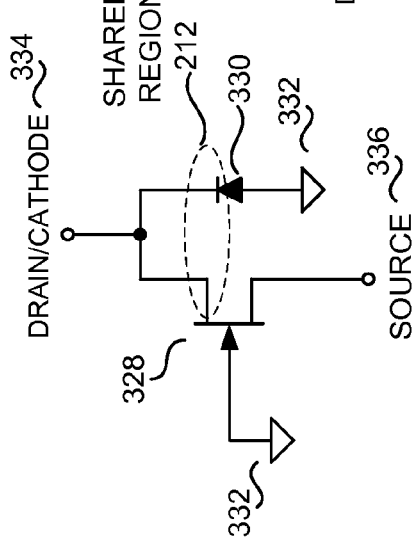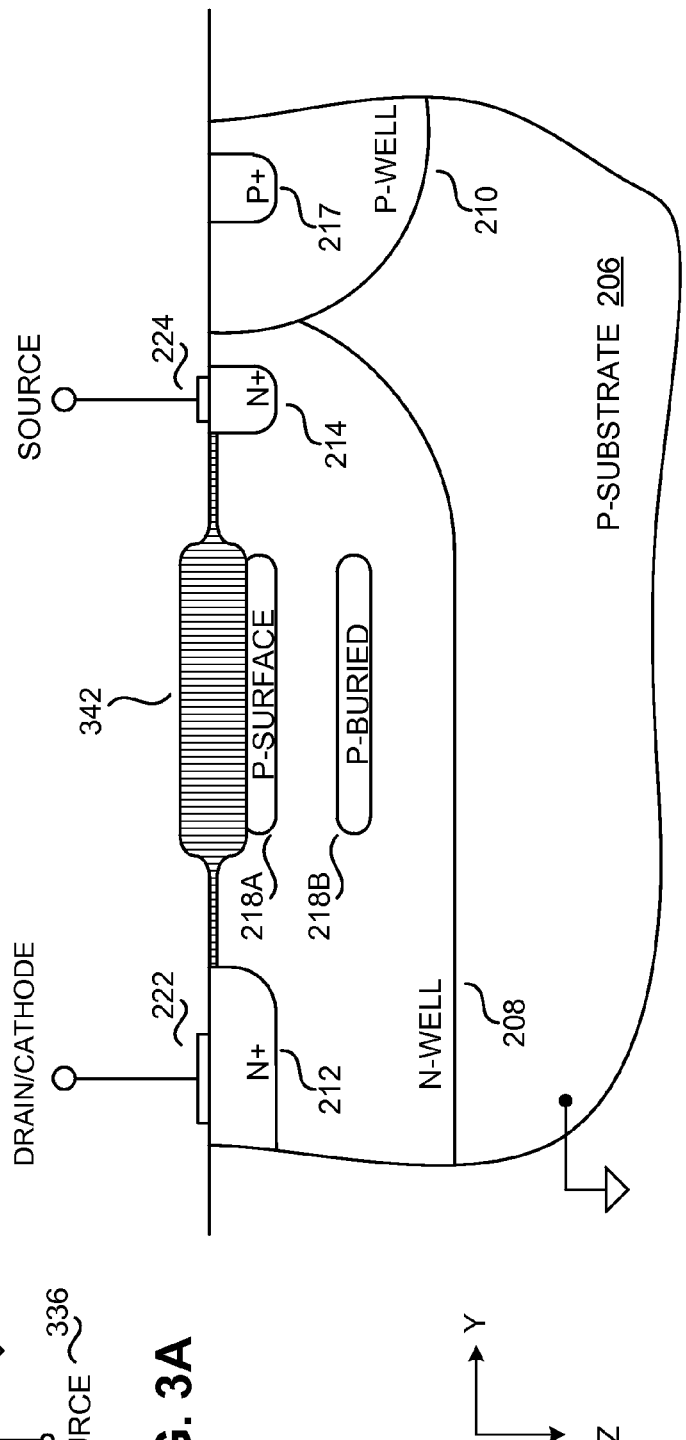

US 9,087,713 B2

SEMICONDUCTOR DEVICE WITH SHARED REGION

BACKGROUND INFORMATION

1. Field of the Disclosure

The present invention relates generally to high-voltage integrated circuits utilized with power converters and, more specifically, the present invention relates to the semiconductor devices and device structures, and processes for fabricating high-voltage integrated circuits.

2. Background

Many electrical devices, such as cell phones, personal digital assistants (PDA's), laptops, etc., utilize power to operate. Because power is generally delivered through a wall socket as high voltage alternating current (ac), a device, typically referred to as a power converter, can be utilized to transform the high voltage ac input to a well regulated direct current (dc) output through an energy transfer element. Switched mode power converters are commonly used due to their high efficiency, small size, and low weight to power many of today's electronics. In operation, a switch is utilized to provide the desired output quantity by varying the duty cycle (typically the ratio of the on-time of the switch to the total switching period), varying the switching frequency, or varying the number of pulses per unit time of the switch in a power converter.

A power converter may use a controller, which is generally an integrated circuit, to provide output regulation to an electrical device (generally referred to as a load). The power converter may include a circuit which provides power to the controller during the start-up of the power converter. In one example, the power converter may use a resistor to provide the start-up function. The resistor may provide a high voltage dc from an output of a bridge rectifier or winding to the controller. During start-up, the high voltage dc provided by the resistor may be used to charge a capacitor for the controller. The capacitor may also provide power to the controller after start-up. In another example, a voltage regulator may be utilized in lieu of a resistor to perform the start-up function.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 3A illustrates an example schematic of a semiconductor device having a shared region, in accordance with the teachings of the present disclosure.

FIG. 3B illustrates a cross sectional view of the example semiconductor device of FIG. 2A along section lines A-A'.

Figure 1:
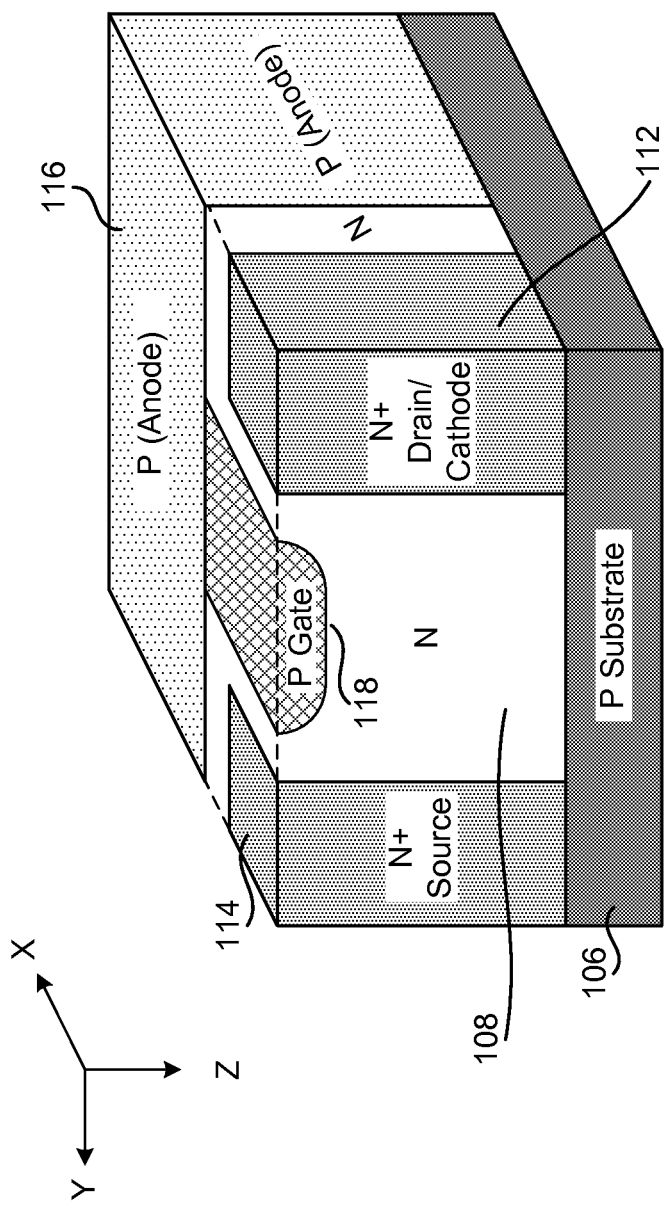
FIG. 1 illustrates a perspective view of a semiconductor device having a shared region, in accordance with the teachings of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

As mentioned above, a resistor or a voltage regulator may provide the start-up function for the power converter and controller. However, utilizing a resistor is generally expensive and requires a large area of the power converter. In addition, the resistor also lowers the efficiency of the power converter since the resistor is dissipating power continuously, even after start-up is completed.

Instead, a voltage regulator which is internal to the controller, and also included in the integrated circuit, may be utilized. The voltage regulator may be turned off after the start-up function has been completed and can be turned on only when needed, which eliminates the extra power dissipation from utilizing a resistor for start-up. However, the voltage regulator included within the integrated circuit of the controller utilizes a significant area on the integrated circuit. In addition, the voltage regulator is prone to electrostatic discharge (ESD) and safe operating area (SOA) damage.

Thus, embodiments of the present invention utilize a junction field effect transistor (JFET) coupled with a diode to provide start-up function along with ESD protection. In addition, the junction field effect transistor (JFET) may also provide power to the controller after start-up. Further, the JFET may also limit the voltage provided to the controller. For example, the JFET may limit the voltage at the source to protect further circuitry in the controller. The JFET and diode may be included within the integrated circuit and may occupy the same area of the integrated circuit. In one lateral direction, the device may be a JFET while in the other lateral direction, the device is a diode. Further, the JFET and the diode may be customized separately without affecting the properties of the other.

FIG. 1 illustrates a perspective view of a semiconductor device 100 having a shared region 112, in accordance with the teachings of the present disclosure. Semiconductor device 100 includes both a junction field effect transistor (JFET) and a diode. The JFET includes an N-type source region 114, a N-type conduction region 108, a P-type gate region 118, and an N-type drain region 112, all disposed on or within substrate 106. The diode includes a P-type anode 116, N-type cathode 112, and n-type region 108. Region 112 is a shared region that is both a drain of the JFET and a cathode of the diode. In addition, a portion of the n-type conduction region 108 may also be shared between the diode and the JFET. In other words, the cathode of the diode may include the n-type region 112 and the n-type region 108. The illustrated embodiment of semiconductor device 100 includes the diode and JFET arranged in substrate 106 such that their respective current flows are perpendicular to one another. That is, when conducting, the JFET includes current flow between the shared region 112 and the source region 114 along the y-axis, while when the diode is forward biased, current flows between the anode 116 and shared region 112 along the x-axis. Similarly, when the diode is in avalanche, current flows between the shared region 112 and the anode 116 along the x-axis. FIG. 1 includes a left-handed coordinate system to help illustrate the semiconductor device 100.

In one embodiment, semiconductor device 100 of FIG. 1 may be included in an integrated control circuit for use in a power converter for supplying power to operate the control circuit and for simultaneously providing electrostatic discharge (ESD) protection. The semiconductor device 100 of FIG. 1 may also protect circuitry of the control circuit. The JFET portion of the semiconductor device 100 may be biased to allow current flow along the y axis for operating the integrated control circuit, while the diode is configured such that it has a breakdown voltage to allow current flow along the x-axis to ground via anode region 116 during an ESD event. In addition, the JFET portion of the semiconductor device may be configured to limit the voltage of the n+ source 114. Including a shared region, such as shared region 112 minimizes the die area consumed by semiconductor device 100 while also allowing the designer to customize the properties of the JFET without affecting the properties of the diode, and vice versa.

Figure 2A:
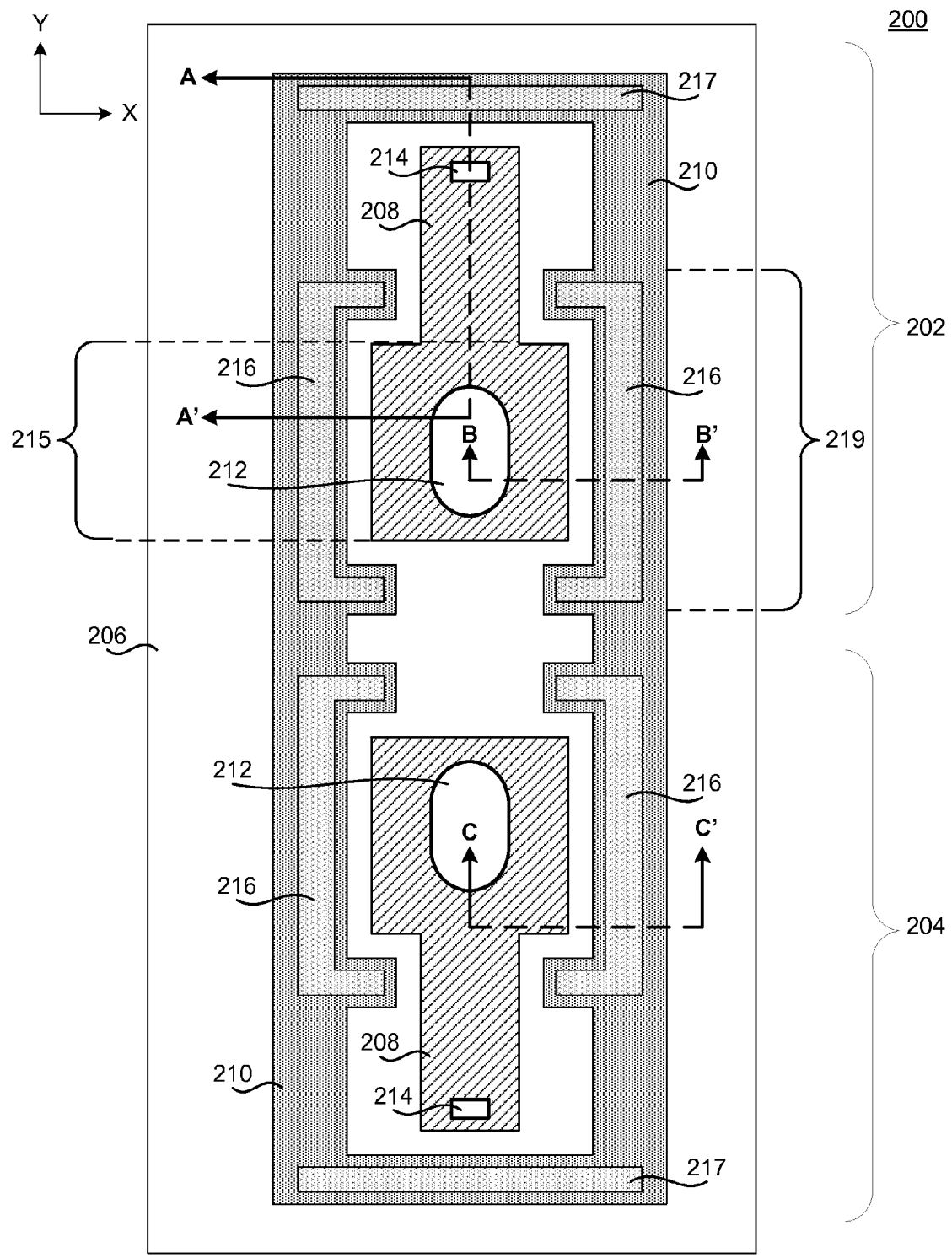
FIGS. 2A-2D illustrate various top views of an example circuit layout of a semiconductor device having a shared region, in accordance with the teaching of the present disclosure.

FIGS. 2A-2D illustrate various a top views of an example circuit layout of a semiconductor device 200 having a shared region 212, in accordance with the teaching of the present disclosure. FIG. 2A illustrates two semiconductor devices 202 and 204, both on a single die, and each including a respective shared region 212. Semiconductor device 202 and 204 may each be an implementation of semiconductor device 100 of FIG. 1. Although FIGS. 2A-2D illustrate two semiconductor devices (202 and 204), only the semiconductor device 202 will be described in detail for ease of explanation, but the details provided herein apply equally to semiconductor device 204.

Figure 2B:
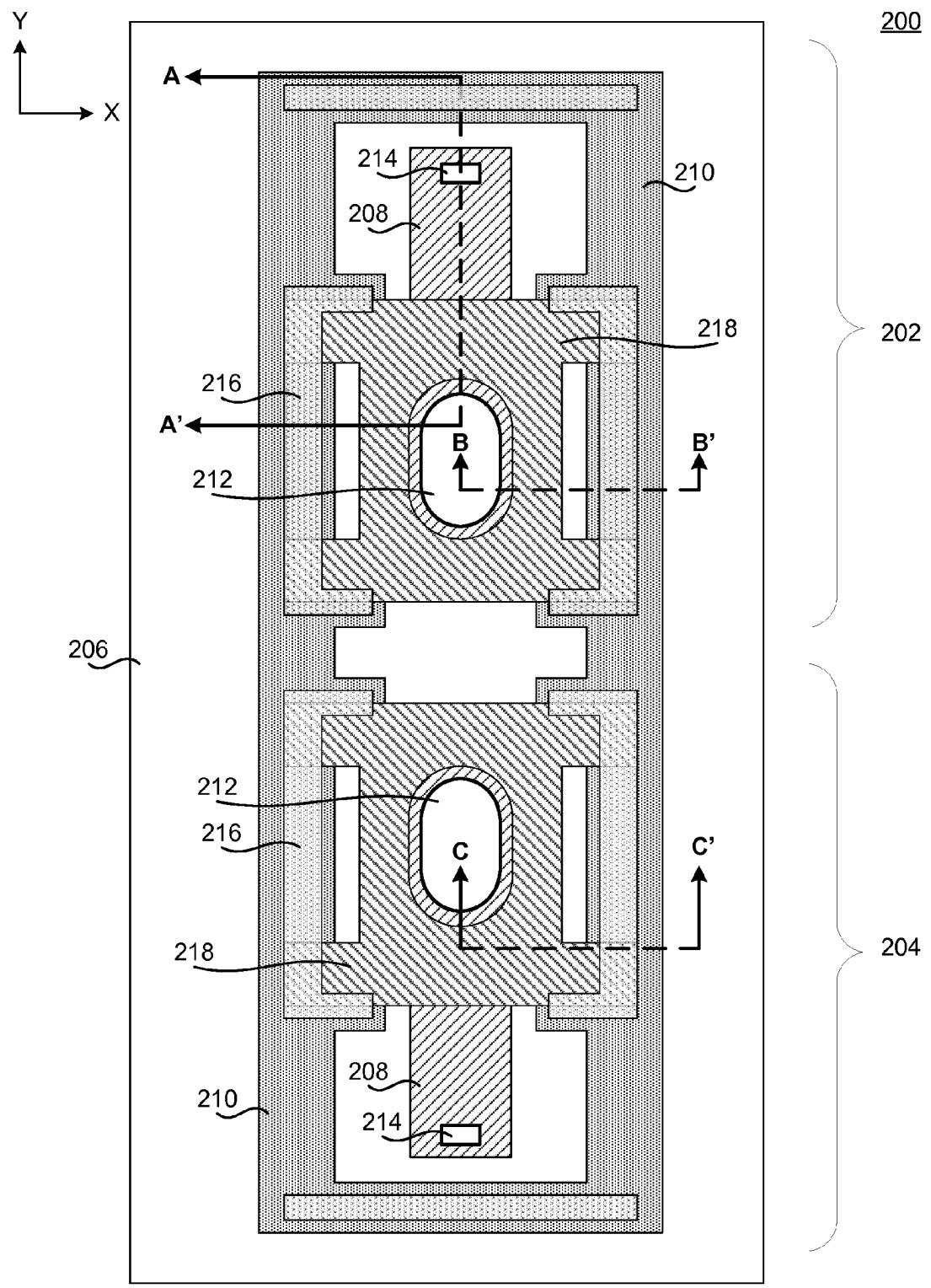

The illustrated embodiment of semiconductor device 202 includes a p-type substrate 206, an n-well 208, a p-well 210, an n+ shared region 212, an n+ source region 214, p+ anode regions 216, and a p-type gate region 218 (shown in FIG. 2B). Further shown is p+ region 217, which may be optional. The JFET of semiconductor device 202 includes the n+ source region 214, p-type gate region 218, n-well 208 and shared region 212 (i.e., drain). The diode of semiconductor device 202 includes the p+ anode regions 216, shared region 212 (i.e., cathode), n-well 208, and p-well 210. Thus, shared region 212 is both the drain of a JFET and the cathode of the diode. In addition, a portion of the n-well 208 is also shared between the JFET and the diode. For example, a second shared region 215, that includes a portion of the n-well 208 immediately surrounding n+ shared region 212, may be utilized as both the cathode of the diode and as a conduction channel of the JFET.

P-well 210 is disposed in the substrate and helps to electrically isolate the JFET from other devices on the die. In one example, substrate 206 includes several rows of semiconductor devices, such as devices 202 and 204, where p-well 210 separates the JFET of one device from the JFET of another. In one embodiment, the p-well 210 may laterally surround the n-well 208. As shown in FIG. 2A, the p-well 210 substantially surrounds both the n-wells 208 for semiconductor devices 202 and 204.

In addition, a portion of p-well 210 may be utilized as the anode of the diode. For example, in the illustrated embodiment of FIG. 2A, the anode of the diode may include P+ anode regions 216 and those portions 219 of p-well 210 that immediately surround the P+ anode regions 216.

The n-well 208 is also disposed in substrate 206 adjacent to p-well 210. It should be appreciated that FIGS. 2A-2D illustrate the drawn distances of each region before diffusion of the dopants and that after diffusion one or more of the regions may be adjoining. As shown in FIG. 2A n+ shared region 212 is disposed within n-well 208. In the example shown, from the top view of the device, the n+ shared region 212 has a substantially oval shape. In other words, the n+ shared region 212 is substantially round in shape. N+ source region 214 is also disposed within n-well 208. In FIG. 2A, the top view of the n+ source region 214 is substantially rectangular in shape. Furthermore, the size, placement, and doping of N-well 208 facilitates the JFET and diode to be high-voltage devices (e.g., capable of supporting 150 volts or more in an off state).

P+ anode regions 216 are disposed within the p-well 210 to the left and right of the n-well 208 along the x-axis. The notches in the p-well 210 and p+ anode regions 216 facilitate pinch-off in those areas. In one embodiment, the p+ anode region 216 is tied to ground. From the top view as shown, the p+ anode regions 216 traverse the p-well 210 along the y-axis between the notches of the p-well 210. In another embodiment, the p+ anode regions 216 may traverse the entirety of the p-well 210 along the y-axis. The drawn distance between the p-well 210 and the n-well 208 along the B-B' axis (shown as distance D 223 in FIG. 2C) partially determines the breakdown voltage of the diode. In one embodiment, this distance is relatively small, resulting in a lower breakdown voltage for ESD protection. In one example, the diode avalanches at 150V and the drawn distance is substantially between 3-6 microns (μm). Optionally, p+ region 217 may be disposed within the p-well 210 above the n-well 208 along the y-axis. P+ region 217 may traverse the p-well 210 along the x-axis. The optional p+ region 217 may provide a contact to the p-well 210.

Turning now to FIG. 2B, p-type gate region 218 is shown. In one embodiment, p-type gate region is a surface region on the top of n-well 208. In some examples, semiconductor device 202 includes additional buried p-type gate regions within the n-well 208 and p-well 210, which will be discussed in more detail below. The additional buried p-type gate regions are disposed below the p-type surface region. In one embodiment, the surface and buried p-type gate regions 218 are disposed within n-well 208 to create depletion regions for the JFET. In the embodiment shown, the p-type gate region 218 laterally surrounds the n+ shared region 212. In one embodiment, portions of the p-type gate region 218 are disposed within the p-well 210, as will be further shown with respect to FIG. 5. In other embodiments, portions of the p-type gate region 218 are also disposed within the p+ anode regions 216. As shown, the sections of the p-type gate region 218 above and below the n+ shared region 212 along the y-axis are disposed within the p-well 201. In addition, the sections of the p-type gate region 218 above and below the n+ shared region 212 along the y-axis are also disposed within the p+ anode 216.

Figure 2D:
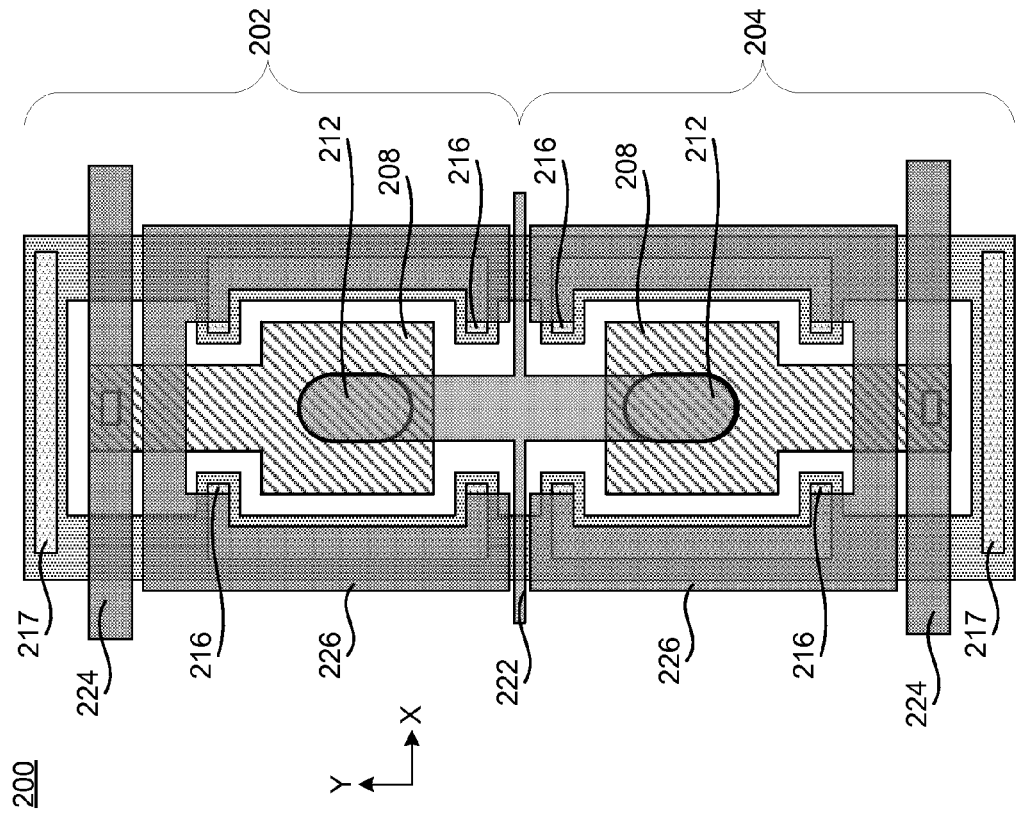
Figure 2C:
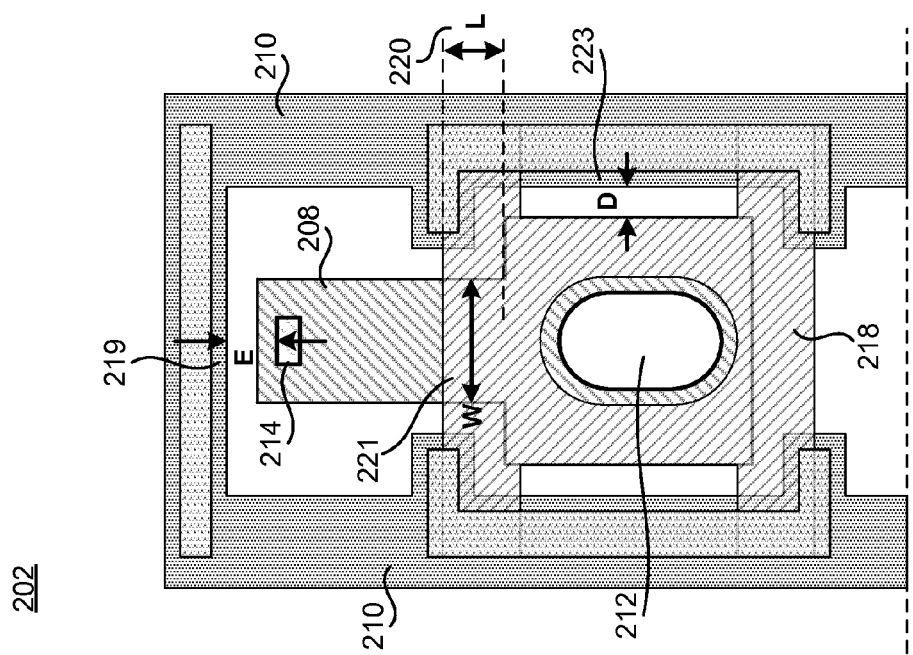

FIG. 2C is a zoomed in view of a single semiconductor device 202 in accordance with the present disclosure. FIG. 2C illustrates various dimensions of the semiconductor device 202. For example, length L 220 and width W 221 define the length and width, respectively, of the p-type gate regions 218. More specifically, the length L 220 and width W 221 define the length and width, respectively, of the p-type gate regions 218 which are disposed within the n-well 208 between the shared region 212 and n+ source region 214. For the example shown, the length L 220 and the width W 221 are the dominant lengths and widths which characterize the semiconductor device 202. In one embodiment, the JFET of device 202 includes a maximum source voltage with respect to the drain voltage and a maximum drain current with respect to the drain voltage and. The maximum source voltage may be referred to herein as the tap voltage or pinch-off voltage. In the illustrated embodiment of FIG. 2C, the tap voltage and maximum drain current are at least partially determined by the ratio of the channel width W 221 and the channel length L 220. The greater the ratio of the channel width W 221 to the channel length L 220, the greater the maximum drain current and tap voltage. However, in some applications it may be desirable to limit the tap voltage, such as in applications where the JFET is used to protect further circuitry in an integrated control circuit. In one embodiment, the tap voltage is limited to approximately 40-50 V.

Drawn distance E 219, as illustrated in FIG. 2C is the distance between the n+ source region 214 and the p-well 210 along the y-axis. In one embodiment, the drawn distance E 219 at least partially determines the breakdown voltage of the JFET of the device 202. In one embodiment, the greater the distance, the higher the breakdown voltage. For example, the drawn distance E 219 is substantially 9 microns (μm).

Drawn distance D 223, as illustrated in FIG. 2C is the distance between n-well 208 and p-well 110. In one embodiment, drawn distance D 223 at least partially determines the breakdown voltage of the diode of device 202. In one example, the drawn distance D 223 is substantially between 3-6 microns (μm). In one embodiment, the breakdown voltage of the JFET is much greater than the breakdown voltage of the diode.

FIG. 2D illustrates semiconductor devices 202 and 204 along with additional metal connects, in accordance with an embodiment of the present invention. As shown, semiconductor devices 202 and 204 include metal connects 222, 224, and 226. Metal connect 222 is disposed to electrically couple the shared region 212 of device 202 with the shared region 212 of device 204. As illustrated, metal connect 222 is disposed such that the shared region 212 is vertically disposed along the z-axis between the metal connect 222 and substrate 206. In addition, metal connect 222 also traverses across the x-axis between the first device 202 and second device 204 which allows multiple shared regions to be coupled together when multiple devices are coupled together side by side. Metal connect 222 is common to both the drain of the JFET and the cathode of the diode.

Metal connects 224 provide contact for the n+ source regions 214. Metal connects 224 is disposed such that the n+ source regions 214 is vertically disposed along the z-axis between the metal connects 224 and substrate 206. Further, the metal connects 224 traverse along the x-axis across devices 202 and 204 which allows multiple n+ source regions to be coupled together when multiple devices are coupled together side by side.

Lastly, metal connect 226 is disposed to couple the p+ anode regions 216 together. As illustrated, metal connect 226 has two metal regions which traverse along the y-axis and another metal region along the x-axis which joins the two metal regions along the x-axis. Or in other words, metal connect 226 is in a substantially "U" shape. Further, metal connects 226 allow multiple p+ anode regions 216 to be coupled together when multiple devices are coupled together side by side.

Referring now back to FIG. 2A, device 202 is a JFET in one lateral direction, and is a diode in another lateral direction. In one example, the lateral directions are orthogonal to each other. As illustrated, the device 202 is a JFET along the y-axis and a diode along the x-axis. Thus, two different devices are within the same die area for semiconductor device 202, where the two devices share a doped region for operation. In addition, the properties of either the JFET or the diode may be altered without affecting the other.

FIG. 3A illustrates an example schematic of a semiconductor device having a shared region 212, in accordance with the teachings of the present disclosure. That is, the circuit of FIG. 3A may be a schematic representation of any of the semiconductor devices mentioned herein, including semiconductor devices 100, 202, and 204. As shown, the semiconductor device of FIG. 3A includes a JFET 328 and a diode 330. JFET 328 includes a gate, a source 336, and a drain 334, while diode 330 includes an anode and a cathode 334. The gate of JFET 328 and the anode of diode 330 may be coupled to a common reference 332 (e.g., ground). However, in another embodiment, the gate of JFET 328 may, instead, be coupled to receive a control signal rather than to common reference 332. FIG. 3A illustrates the drain of JFET 328 coupled to the cathode of diode 330, to represent that the drain and the cathode are in fact the same region of the substrate (shown as shared region 212). As will be discussed with reference to FIG. 6, the equivalent schematic of FIG. 3A may be utilized as a start-up circuit for an integrated control circuit with corresponding ESD protection. The equivalent schematic of FIG. 3A may also be utilized to provide power after start-up. Further, the equivalent schematic may also protect circuitry within the integrated control circuit.

FIG. 3B illustrates a cross sectional view of the example semiconductor device 202 of FIG. 2A along section lines A-A'. As the cross sectional view of FIG. 3B is along the y-axis, FIG. 3B primarily illustrates the JFET of semiconductor device 202. As shown in FIG. 3B, substrate 206 is a p-type substrate with n-well 208 and p-well 210 implanted into substrate 206 adjacent to one another. The cross sectional view of semiconductor device 202 is after drive-in diffusion. Thus, some regions shown in FIG. 3B have diffused, such as the n-well 208 and p-well 210 which are shown as diffused together such that they adjoin one another. In addition, FIG. 3B is a conceptual side view of the semiconductor device 202 and dimensions may be exaggerated or compressed to illustrate the invention.

Disposed within n-well 208 is shared region 212 and n+ source region 214. As mentioned above, shared region 212 is both the drain of the JFET and the cathode of the diode. Further shown as disposed in n-well 208 is p-type gate regions 218A and 218B. In the illustrated embodiment p-type gate region 218A is a surface region disposed at the surface of substrate 206 and p-type gate region 218B is a buried region disposed within n-well 208 and vertically spaced apart from the surface region 218A. The regions of the n-well 208 between the p-type gate region 218A, p-type region 218B, and the p-substrate 206 define JFET conduction channels. As shown in FIG. 3B, p-type gate regions 218A and 218B are laterally disposed between the n+ source region 214 and the shared region 212. In addition, as discussed above with reference to FIG. 2A, a portion of the n-well region 208 is also shared between the JFET and the diode. For example, the cathode of the diode may also comprise a portion of the n-well region 208. Further, shared region 212 may be an n+ region which is utilized to contact the n-well region 208. As such, the n-well region 208 may be utilized for the cathode of the diode and the conduction channel of the JFET.

Metal connect 222 is shown as being disposed atop the shared region 212 for electrically connecting shared region 212 to shared regions of other devices (see FIG. 2C). In addition, metal connect 224 is shown as disposed atop n+ source region 214.

Disposed within p-well region is shown p+ region 217 which may provide contact to the p-well 210. It should be appreciated that the p+ region 217 may be optional. Also shown in FIG. 3B is a thick oxide region 342 disposed atop the device laterally between the shared region 212 and the n+ source region. The thick oxide region 342 may be used to isolate the semiconductor device from additional layers (not shown) which may be disposed on the semiconductor device.

Figure 4:
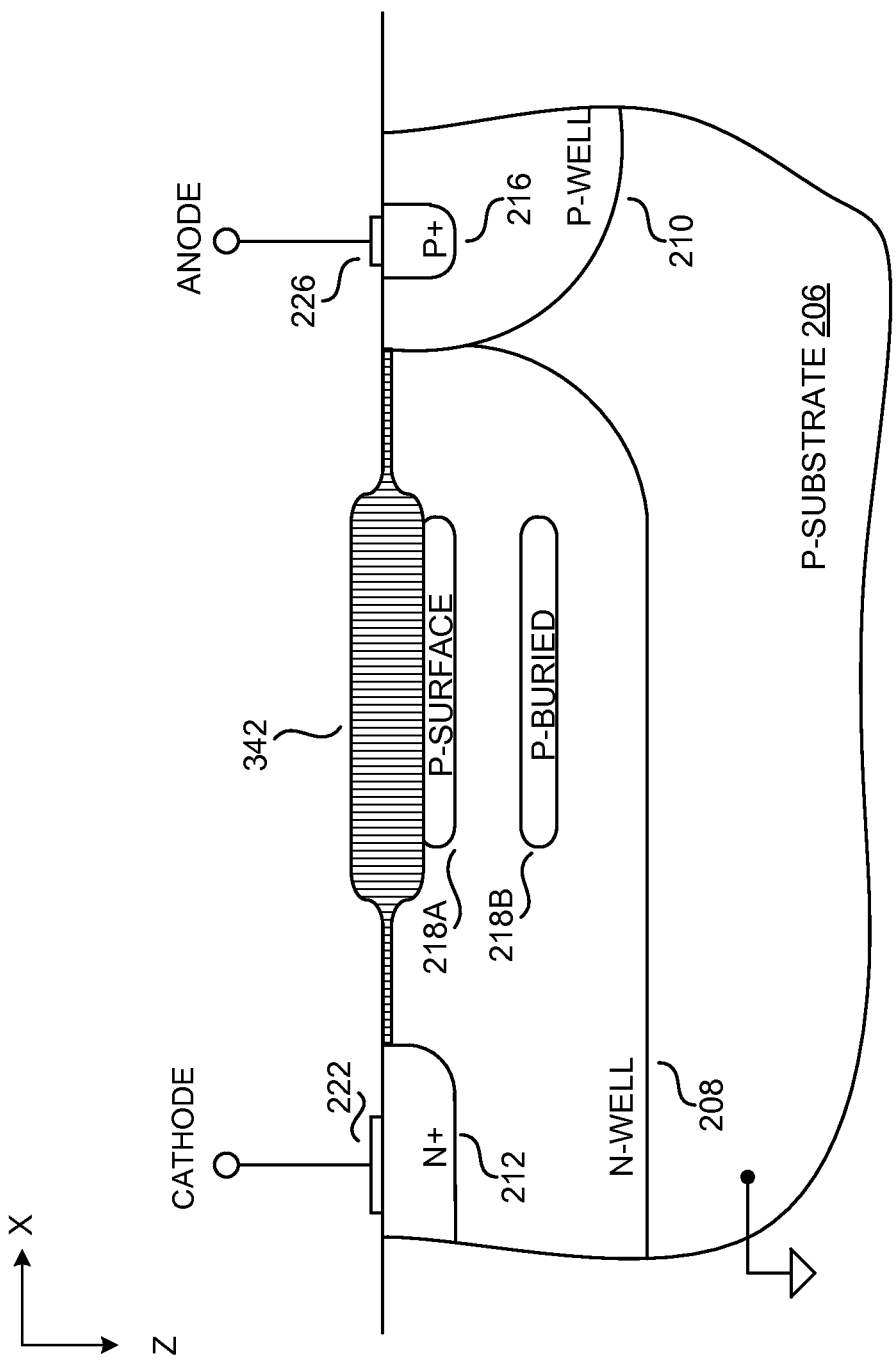
FIG. 4 illustrates a cross sectional view of the example semiconductor device of FIG. 2A along section lines B-B'.

FIG. 4 illustrates a cross sectional view of the example semiconductor device 202 of FIG. 2A along section lines B-B'. As the cross sectional view of FIG. 4 is along the x-axis, FIG. 4 primarily illustrates the diode of semiconductor device 202. As with FIG. 3B, FIG. 4 illustrates semiconductor device 202 after drive-in diffusion. Thus n-well 208 and p-well 210 are shown as adjoining due to diffusion of their respective dopants. In addition, FIG. 4 is a conceptual side view of the semiconductor device 202 and dimensions may be exaggerated or compressed to illustrate the invention.

As shown in FIG. 4, the diode of semiconductor device 202 includes shared region 212 that is the cathode and a p+ region 216 that is the anode of the diode. Further, as discussed above with reference to FIG. 2A, the anode of the diode may comprise a portion of the p-well region 210 and the p+ region 216 may be utilized to contact the p-well region 210. Thus, the cathode of the diode and the drain of the JFET are the same shared region 212. As mentioned above, a portion of the n-well region 208 is also shared between the JFET and the diode. For example, the cathode of the diode may also comprise a portion of the n-well region 208. Further, shared region 212 may be an n+ region which is utilized to contact the n-well region 208. P+ region 216 is shown as coupled to metal connect 226 and electrically coupled to p-well 210, such that the anode of the diode is coupled to a common reference or ground.

In one embodiment, the p-type gate regions 218A and 218B may be optional for the diode, but it is noted that the doping of regions 218A and 218B may partially determine the breakdown voltage of the diode. As mentioned above, the breakdown voltage of the diode is also partially determined by the drawn distance between n-well 208 and p-well 210. The breakdown voltage of the diode is also partially determined by the integrated dose of n-well 208. The p-type gate regions 218A and 218B affect the integrated dose of n-well 208.

Figure 5:
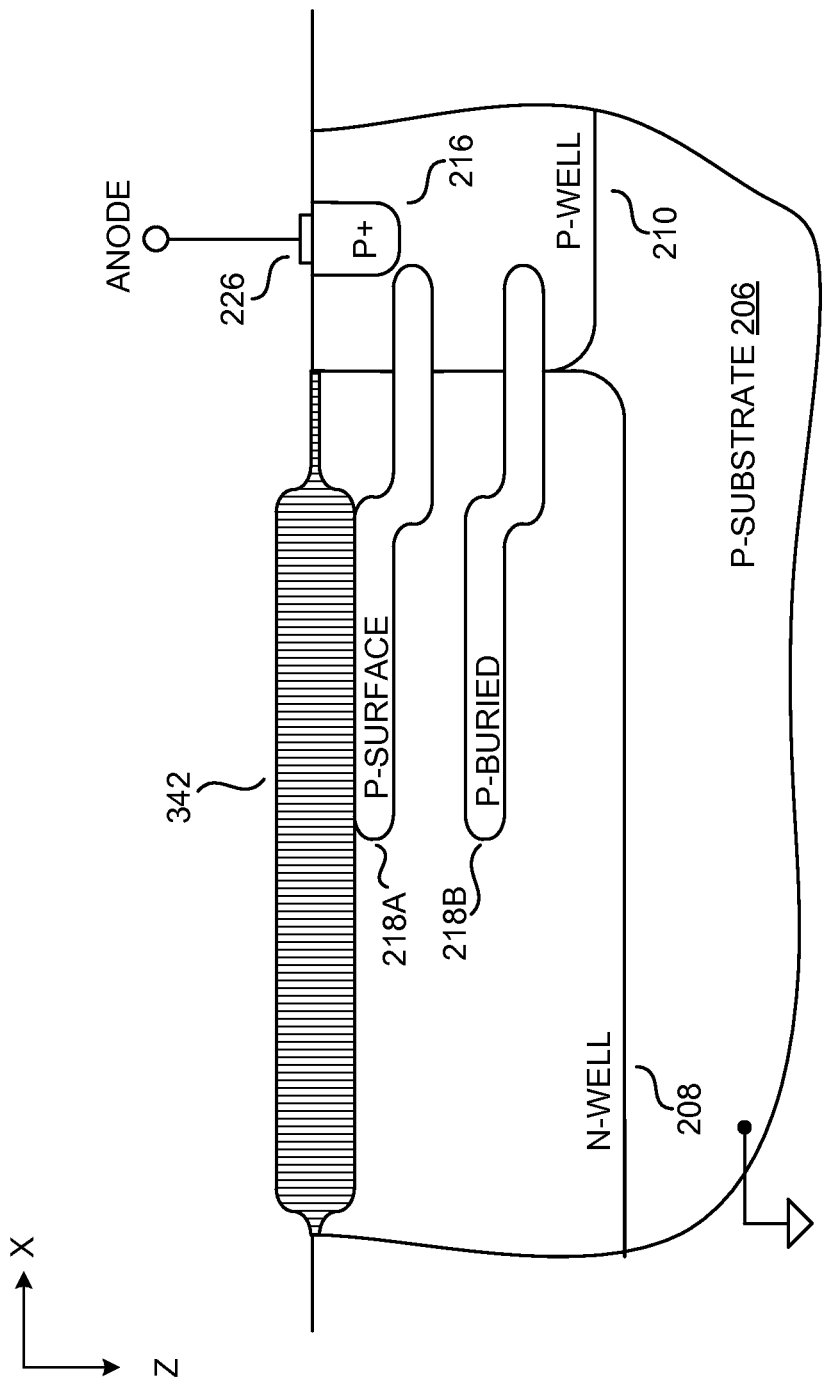
FIG. 5 illustrates a cross sectional view of the example semiconductor device of FIG. 2A along section lines C-C'.

FIG. 5 illustrates a cross sectional view of the example semiconductor device 204 of FIG. 2A along section lines C-C'. The illustrated example of semiconductor device 204 in FIG. 5 illustrates the p-type gate regions 218A and 218B extending through n-well 208 and into p-well region 210 to electrically couple to p-well region 210. However, the p-well region 210 is electrically coupled to the p-substrate 206. As such, the gate regions of the JFET are coupled to the common reference or ground. In addition, FIG. 5 is a conceptual side view of the semiconductor device 202 and dimensions may be exaggerated or compressed to illustrate the invention.

Figure 6:
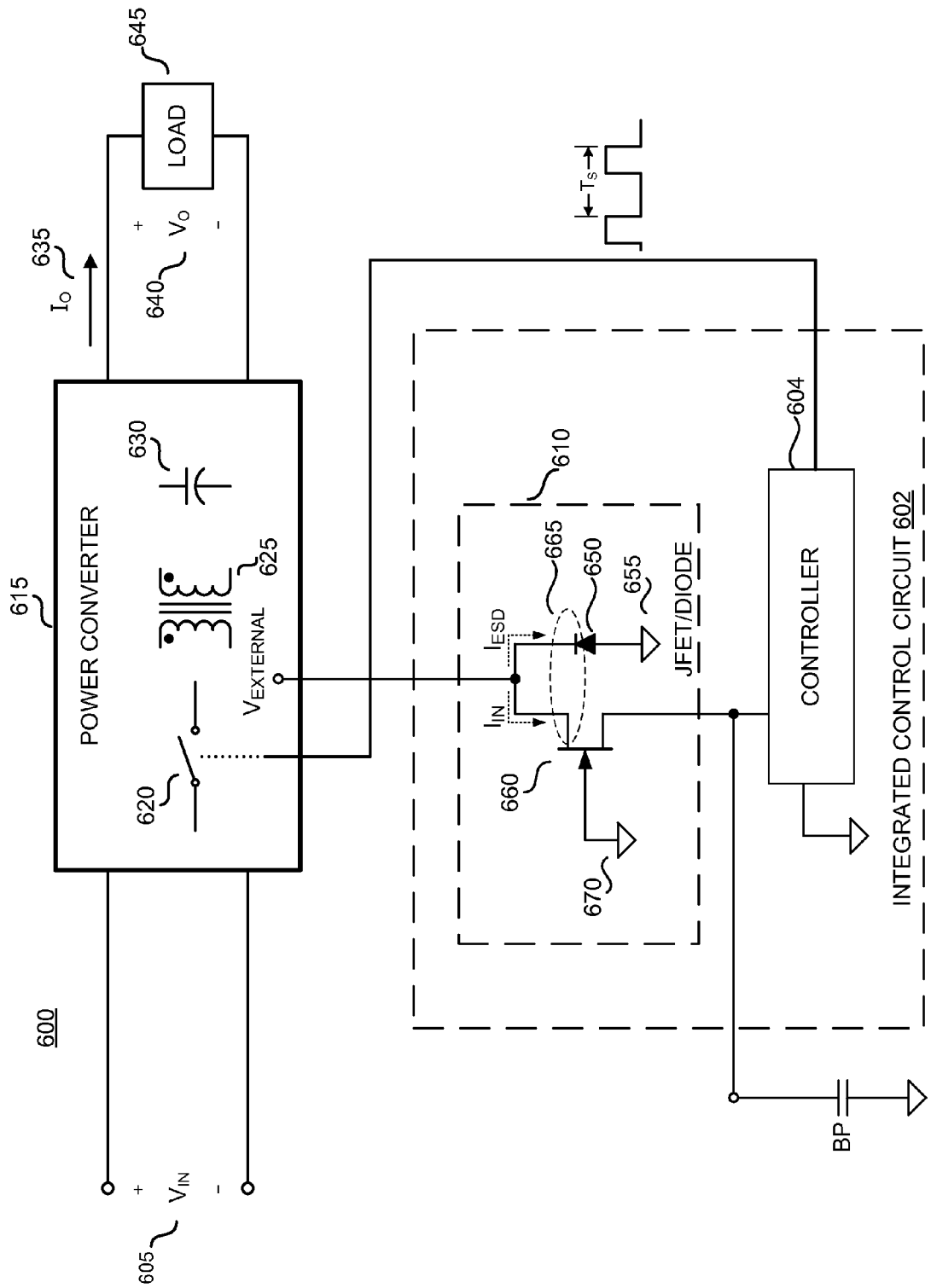
FIG. 6 illustrates a functional block diagram of an example of a power converter including a semiconductor device having a shared region, in accordance with the teachings of the present disclosure.

FIG. 6 illustrates a functional block diagram of an example of a power supply 600 including a semiconductor device 610 having a shared region 665, in accordance with the teachings of the present disclosure. Power supply 600 receives an input voltage $V_{IN}$ 605 to produce an output voltage $V_O$ 640 and an output current $I_O$ 635 at a load 645. In one example power supply 600 is an ac-dc power supply, where dc input voltage $V_{IN}$ 605 is a rectified and filtered ac input voltage received from an input voltage source (not shown).

The power supply 600 in the example of FIG. 6 includes a power converter 615 that is controlled by a controller 604 to regulate the output voltage $V_O$ 640, the output current $I_O$ 635, or a combination of both. The power converter 615 typically includes at least one switch 620, at least one energy transfer element 625 (such as a coupled inductor or a transformer), and at least one capacitor 630. Most standard converter configurations used to provide galvanically isolated outputs, such as for example the flyback converter and for example the many variants of the buck converter may be realized by an arrangement of switches, coupled inductors, and capacitors represented by the power converter block 615 in the example of FIG. 1. It should be appreciated that power converter 615 may be a non-isolated power converter.

Controller 604 is included in an integrated control circuit 602, which also includes semiconductor device 610. As shown in FIG. 6, semiconductor device 610 is a combined JFET 660 and diode 650, and may include any of the semiconductor devices described herein, including semiconductor device 100, 202, and 204. JFET 660 and diode 650 include a shared region 665, in accordance with the embodiments disclosed herein. Thus, semiconductor device 610 may occupy a reduced area within integrated control circuit 602 when compared with conventional circuits.

As shown, JFET 660 may conduct an input current $I_{IN}$ such that semiconductor device provides power to operate integrated control circuit 602, at least, during a start-up phase of the control circuit. The JFET 660 may also provide power to operate the integrated control circuit 602 after start-up. In one embodiment, the start-up phase starts at a power up of the device and ends once a voltage on the bypass capacitor BP has reached a threshold value. JFET 660 may also have a tap or pinch-off voltage so as to provide protection to circuits within controller 604. For example, the source voltage (i.e. the tap voltage or pinch-off voltage) of the JFET may be limited to protect circuits within controller 604.

The drawn distance of diode 650 is configured to provide a breakdown voltage that is low enough for ESD protection. Further, the breakdown voltage of the JFET is greater than the breakdown voltage of the diode. During an ESD event (i.e., breakdown voltage of diode 650 is exceeded), diode 650 is coupled to shunt the excess ESD current $I_{ESD}$ to ground so as to further protect circuits within controller 602.

As mentioned above, semiconductor device 610 is JFET 660 in one lateral direction and is diode 665 in another lateral direction. Thus, the input current $I_{IN}$ flows between the drain (i.e., shared region 665) and source in a first lateral direction (e.g., y-axis of FIG. 2A) of the control circuit 602, and ESD current $I_{ESD}$ flows between the cathode (i.e., shared region 665) and anode in a second lateral direction (e.g., x-axis of FIG. 2A) during an ESD event. In one example, input current $I_{IN}$ flows between the drain and source during the start-up phase of the control circuit. In addition, the maximum source voltage (or tap voltage) is limited to provide protection for circuits within controller 604.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

What is claimed is:

1. A semiconductor device having a junction field-effect transistor (JFET) and a diode, the device comprising:
   a substrate of a first conductivity type;
   a first well region of a second conductivity type disposed in the substrate;
   a second well region of the first conductivity type disposed in the substrate adjacent to the first well region in a lateral direction with respect to the first well region;
   a first doped region of the second conductivity type disposed in the first well region, wherein a source of the FET includes the first doped region;
   a second doped region of the first conductivity type disposed within the second well region such that both the second doped region and the second well region are disposed in the substrate in the lateral direction with respect to the first well region along a first lateral axis of the device, wherein the second doped region is more heavily doped than the second well region, and wherein an anode of the diode includes the second doped region; and
   a shared region of the second conductivity type disposed in the first well region, wherein both a drain of the FET and a cathode of the diode include the shared region, wherein the diode is disposed in the substrate such that a first current flows from the shared region to the second doped region along the first lateral axis of the device, and wherein the FET is disposed in the substrate such that when conducting, a second current flows between the shared region and the first doped region along a second lateral axis of the device, and wherein the FET and the diode are configured such that a breakdown voltage of the FET is greater than a breakdown voltage of the diode.

2. The semiconductor device of claim 1, wherein the first lateral axis is orthogonal to the second lateral axis.

3. The semiconductor device of claim 1, wherein JFET further comprises a first gate region of the first conductivity type disposed in the first well region between the first doped region and the shared region.

4. The semiconductor device of claim 3, further comprising a second gate region of the first conductivity type disposed within the first well region between the first doped region and the shared region, the first and second gate regions being vertically spaced apart to define a JFET conduction channel.

5. The semiconductor device of claim 4, wherein at least one of the gate regions extends from the first well region into the second well region.

6. The semiconductor device of claim 1, wherein the shared region is a first shared region, the semiconductor device further comprising a second shared region that includes at least a portion of the first well region, wherein the both the cathode of the diode and a conduction channel of the JFET include the second shared region.

7. The semiconductor device of claim 1, wherein the breakdown voltage of the diode is responsive to a drawn distance between the first well region and the second well region.

8. The semiconductor device of claim 1, wherein the breakdown voltage of the diode is about 150 volts.

9. The semiconductor device of claim 1, wherein the first conductivity type is P-type and the second conductivity type is N-type, and wherein the second well region is a p-well and the second doped region is a p+ region disposed within the p-well.

10. An apparatus having a first semiconductor device and a second semiconductor device, the apparatus comprising:
    a substrate of a first conductivity type;
    a first well region of a second conductivity type disposed in the substrate;
    a second well region of the first conductivity type disposed in the substrate adjacent to the first well region in a lateral direction with respect to the first well region;
    a first doped region of the second conductivity type disposed in the first well region, wherein the first doped region is a region of the first semiconductor device;
    a second doped region of the first conductivity type disposed within the second well region such that both the second doped region and the second well region are disposed in the substrate in the lateral direction with respect to the first well region along a first lateral axis of the apparatus, wherein the second doped region is more heavily doped than the second well region, and wherein the second doped region is a region of the second semiconductor device; and
    a shared region of the second conductivity type disposed in the first well region, wherein the shared region is both a region of the first semiconductor device and a region of the second semiconductor device, wherein a first current is to flow between the shared region and the second doped region along the first lateral axis of the apparatus, and wherein a second current is to flow between the shared region and the first doped region along a second lateral axis of the device, and wherein the first semiconductor device and the second semiconductor device are configured such that a breakdown voltage of the first semiconductor device is greater than a breakdown voltage of the second semiconductor device.

11. The semiconductor device of claim 10, wherein the first lateral axis is orthogonal to the second lateral axis.

12. The apparatus of claim 10, wherein the shared region is a first shared region, the semiconductor device further comprising a second shared region that includes at least a portion of the first well region, wherein the both regions of the semiconductor device include the second shared region.

13. The apparatus of claim 10, wherein in the first conductivity type is P-type and the second conductivity type is N-type, and wherein the second well region is a p-well and the second doped region is a p+ region disposed within the p-well.

14. An integrated control circuit for use in a power converter, the control circuit comprising:
a controller to be coupled to control switching of a switch to regulate an output of a power converter;
a terminal to be coupled to receive an external voltage; and
a semiconductor device having a junction field-effect transistor (JFET) and a diode both coupled to the terminal to receive the external voltage, the device comprising:
a substrate of a first conductivity type;
a first well region of a second conductivity type disposed in the substrate;
a second well region of the first conductivity type disposed in the substrate adjacent to the first well region in a lateral direction with respect to the first well region;
a first doped region of the second conductivity type disposed in the first well region and coupled to a common reference of the control circuit, wherein a source of the JFET includes the first doped region;
a second doped region of the first conductivity type disposed within the second well region such that both the second doped region and the second well region are disposed in the substrate in the lateral direction with respect to the first well region along a first lateral axis of the device, wherein the second doped region is more heavily doped than the second well region, and wherein an anode of the diode includes the second doped region;
a shared region of the second conductivity type disposed in the first well region and coupled to the terminal, wherein both a drain of the JFET and a cathode of the diode include the shared region, wherein the diode is disposed in the substrate such that a first current flows from the shared region to the second doped region along the first lateral axis of the device, and wherein the JFET is disposed in the substrate such that when conducting, a second current flows between the shared region and the first doped region along a second lateral axis of the device; and
a first gate region of the first conductivity type disposed in the first well region between the first doped region and the shared region, wherein the first gate region is coupled to the common reference of the control circuit, and wherein,
the JFET is coupled to provide power to operate the control circuit at least during a start-up phase of the control circuit, and
the diode is coupled to provide electrostatic discharge (ESD) protection to the control circuit during an ESD event, wherein the JFET and the diode are configured such that a breakdown voltage of the JFET is greater than a breakdown voltage of the diode.

15. The integrated control circuit of claim 14, wherein the first lateral axis is orthogonal to the second lateral axis.

16. The integrated control circuit of claim 14, wherein the semiconductor device further comprises a second gate region of the first conductivity type disposed within the first well region between the first doped region and the shared region, the first and second gate regions being vertically spaced apart to define a JFET conduction channel.

17. The integrated control circuit of claim 16, wherein at least one of the gate regions extends from the first well region into the second well region.

18. The integrated control circuit of claim 14, wherein the shared region is a first shared region, the semiconductor device further comprising a second shared region that includes at least a portion of the first well region, wherein the both the cathode of the diode and a conduction channel of the JFET include the second shared region.

19. The integrated control circuit of claim 14, wherein the breakdown voltage of the diode is responsive to a drawn distance between the first well region and the second well region.

20. The integrated control circuit of claim 14, wherein the breakdown voltage of the diode is about 150 volts.

21. The integrated control circuit of claim 14, wherein the first conductivity type is P-type and the second conductivity type is N-type, and wherein the second well region is a p-well and the second doped region is a p+ region disposed within the p-well.

* * * * *